United States Patent [19]

Chan

[11] Patent Number: 5,274,277
[45] Date of Patent: Dec. 28, 1993

[54] HIGH SPEED "OR" CIRCUIT CONFIGURATION

[75] Inventor: Tim W. Chan, San Jose, Calif.
[73] Assignee: Intel Corporation, Santa Clara, Calif.
[21] Appl. No.: 938,934
[22] Filed: Sep. 1, 1992
[51] Int. Cl.$^5$ .......................................... H03K 19/003
[52] U.S. Cl. .................. 307/443; 307/263; 307/446
[58] Field of Search ............... 307/443, 263, 446, 570

[56] References Cited

U.S. PATENT DOCUMENTS

| | | | |
|---|---|---|---|
| 4,103,188 | 7/1978 | Morton | 307/446 |
| 4,719,370 | 1/1988 | Sugimoto | 307/446 |
| 4,866,304 | 9/1989 | Yu | 307/446 |

*Primary Examiner*—Edward P. Westin
*Assistant Examiner*—Jon Santamauro
*Attorney, Agent, or Firm*—Blakely, Sokoloff, Taylor & Zafman

[57] ABSTRACT

A circuit for providing an OR function on the outputs of at least two MOS logic circuits. The circuit has an output node capable of being in a first or second logic state and being responsive to a first or second path. The first path includes multiple WIRED-OR logic circuits which function as an OR gate on the outputs of MOS logic circuits. The results of the operation cause the architecture output to transition into the first state. The second path is skewed for the second state, such that the transition into the second state occurs fast. Thus, the transition of the output node from the second state to the first state and vice versa is provided by one path, such that the overall ORing function occurs faster.

11 Claims, 3 Drawing Sheets

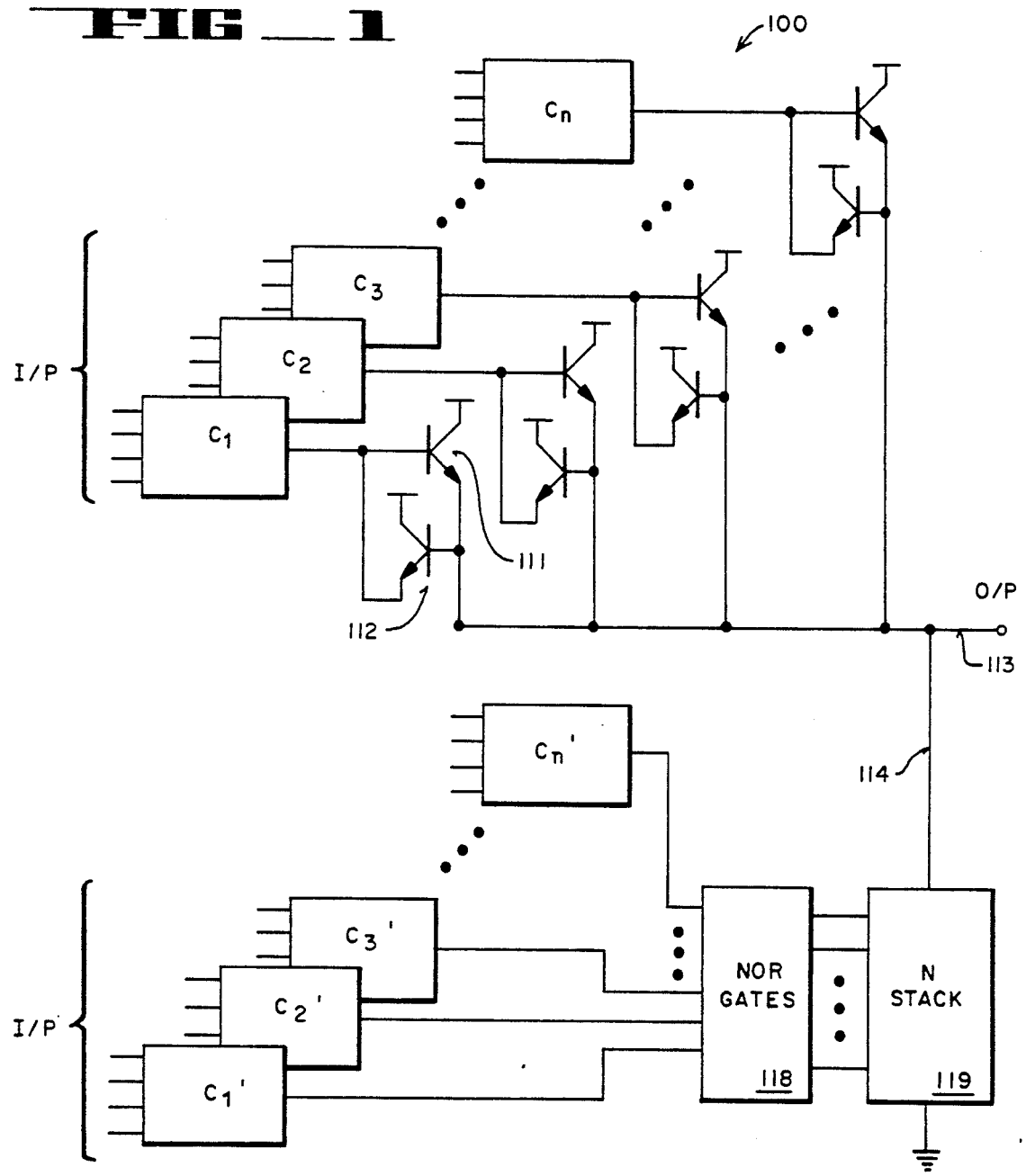
FIG_1

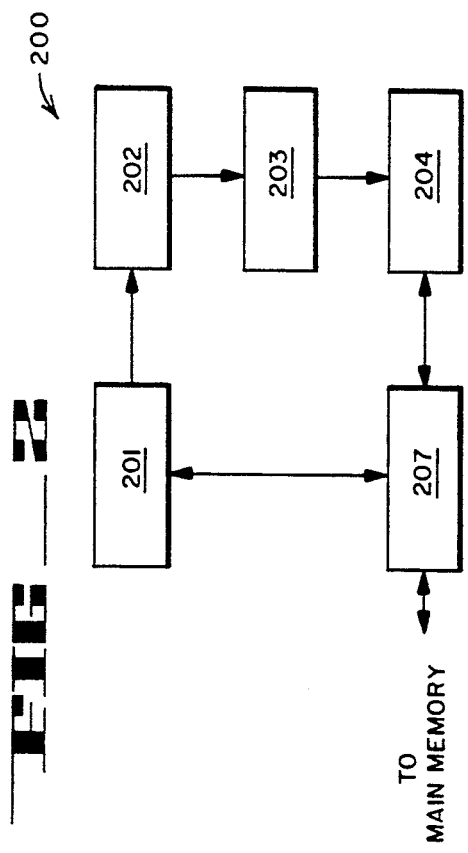
FIG.—2
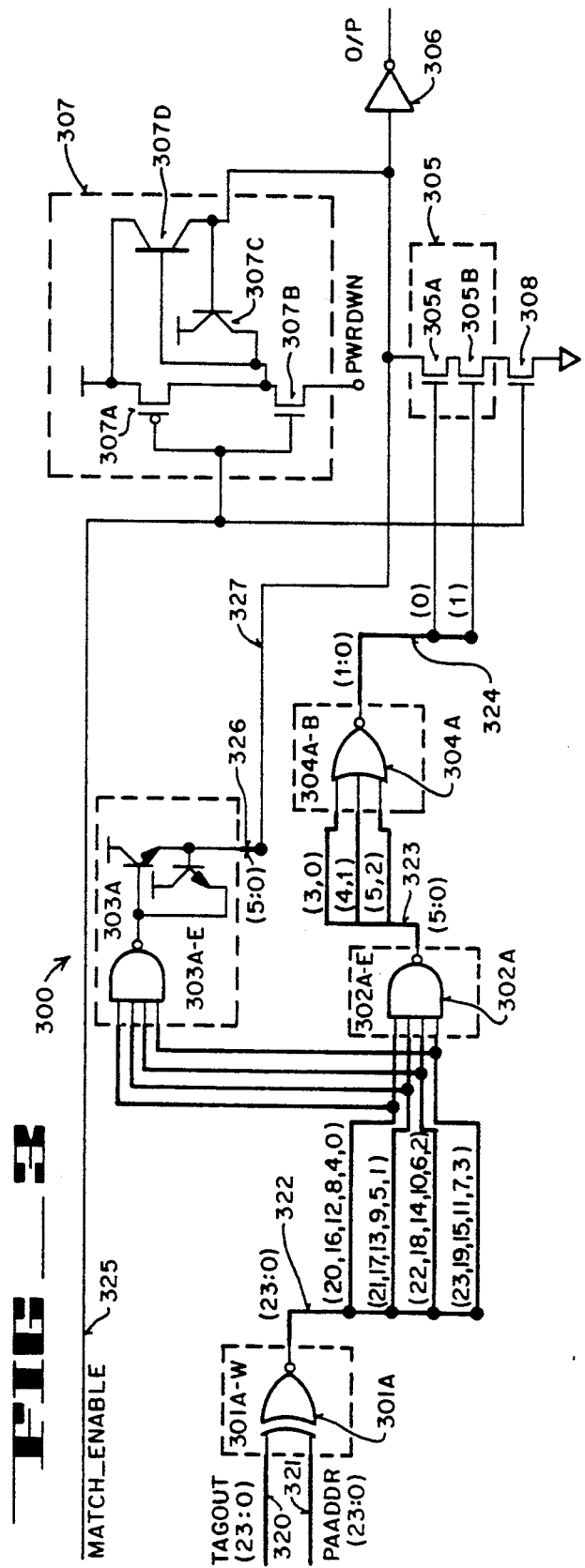
FIG.—3

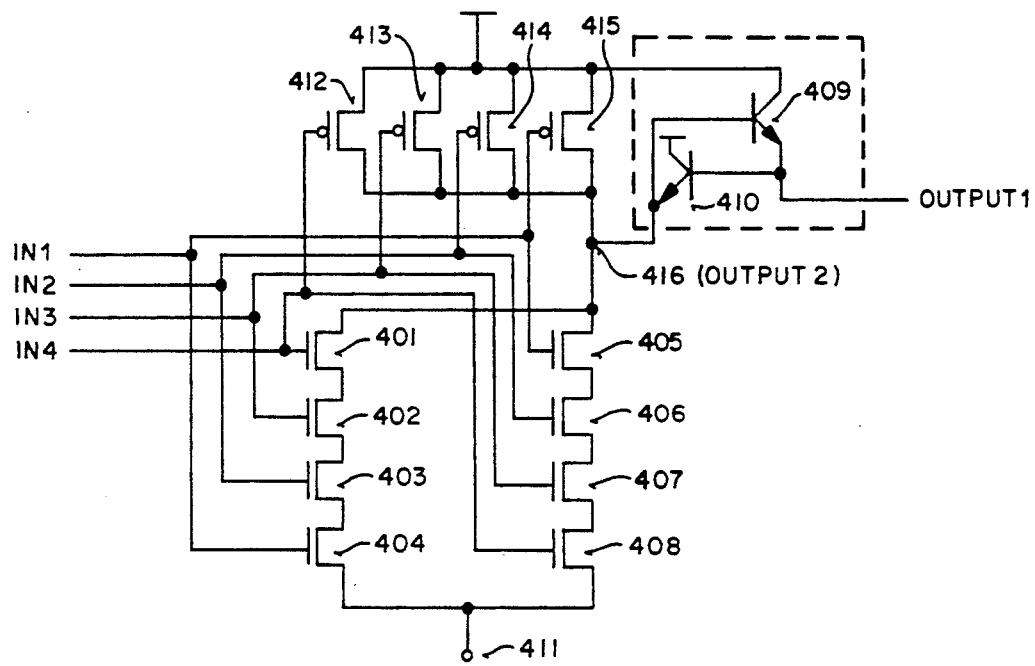
FIG_4
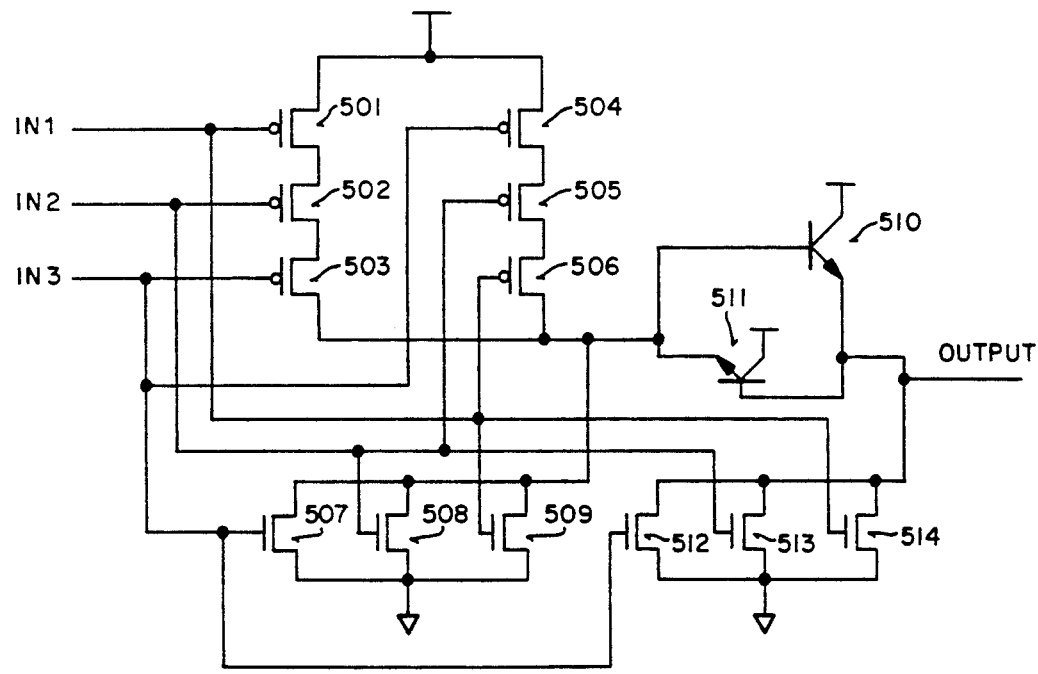
FIG_5

HIGH SPEED "OR" CIRCUIT CONFIGURATION

FIELD OF THE INVENTION

The present invention relates to the field of electronic circuit logic; particularly, the present invention relates to circuit architectures having transitions which are skewed to provide outputs.

BACKGROUND OF THE INVENTION

Today, integrated circuits (ICs) have many applications, including computer systems. ICs consist of arrays of transistors and other circuit logic components which are constructed from a single chip of semiconductor material. The two most popular logic families currently used in ICs are transistor-transistor logic (TTL) and complimentary metal-oxide semiconductor (CMOS). A CMOS IC consists of both n-channel and p-channel MOS field-effect transistors (MOSFETs). NMOS is another family of logic which consists exclusively of n-channel MOSFETs.

CMOS logic is usually preferred over TTL because of the speed it offers and its lower power consumption. One limitation with CMOS is that some common logic gates have implementations which require multiple stages of logic due to the fact that only certain logic gates have simple CMOS implementations. For instance, there is no simple CMOS implementation for an OR logic gate. Thus, to implement an OR gate, a NOR gate is employed. The NOR gate has a simple implementation in CMOS. Since an NOR gate is used, one or more other stages of logic are required to generate an output indicative of an OR gate. Therefore, some common logic gates require multiple stages of logic when implemented in CMOS.

Recently, integrated digital logic circuits have been developed which combine bipolar and CMOS technologies. These circuits are referred to as BiCMOS circuits. The combination of bipolar and CMOS technologies is advantageous in that the beneficial features of each technology may be utilized in combination to provide an optimal circuit. For example, bipolar circuits have fast switching capabilities and typically drive larger capacitive loads. On the other hand, CMOS circuits have the advantage of low power consumption, rail-to-rail output capability, high density and a very high input impedance. Thus, the combination of these features allows the superior aspects of each to be exploited and combined to yield the optimal circuit performance. One variety of BiCMOS is the combination of bipolar and NMOS technologies and is commonly referred to as BiNMOS. BiNMOS circuits also have performance benefits due to the infusion of the two technologies.

Currently, the primary emphasis on ICs has been directed to increasing their speed. Increasing the speed of an IC is especially important for speed critical operations which depend on close timing margins in order to perform their requisite function or arrive at their result. Many of these operations also are found on critical paths. For example, microprocessors which contain and utilize instruction and data caches require large amounts of time to perform tag matches and other access operations in order to determine if the desired data and code can be found in the cache. Typically, the tag matching operations are accomplished in part through the use of comparator logic and circuitry. The comparison function of the tag matching operation is on the critical path of the microprocessor. Thus, the speed of critical path operations is important in the proper functioning of many IC operations. Also the focus on speeding-up ICs is also being applied to those operations which are known historically to require large amounts of time to complete. If the speed of these time-consuming operations can be increased, the overall speed of the IC may be increased. Hence, it is desirable to increase the speed of ICs.

One manner of increasing the speed of circuit logic is to eliminate stages of logic using comparable and interchangeable circuitry. Upsizing of devices is quite often used to improve speed. However, the ability to increase device size is limited by the intrinsic delay and the area constraints. Another method of increasing speed is to skew the sizing of the devices used in the logic circuits. Furthermore, skewing device sizes generally only increases the speed of one logic transition (e.g., the 1-to-0 transition). However, with CMOS technology, increasing the speed of one transition, causes the opposite effect to the other transition. In other words, if the delay of a combinational logic is skewed for one transition (e.g., 1-to-0), the other transition will be skewed in the opposite direction (e.g., 0-to-1). For example, if the 1-to-0 transition is skewed to be fast, the 0-to-1 transition will end up being skewed to be slow. Thus, a need exists for a CMOS circuit architecture which is skewed to be fast for both the 1-to-0 and the 0-to-1 transitions.

As will be shown, the present invention comprises an OR circuit architecture configuration which transitions from 1-to-0 and vice versa in a skewed manner, such that an output of the circuit architecture is generated faster. Furthermore, the present invention uses BiNMOS to obtain the benefits of both MOS and bipolar technologies. The OR circuit architecture of the present invention is also utilized in comparator in a cache of a microprocessor.

SUMMARY OF THE INVENTION

A circuit architecture for providing an OR function on the outputs of at least two MOS logic circuits is described. The circuit architecture has an output capable of being in a first or second state and being responsive to a first or second path. The first path includes multiple WIRED-OR logic circuits which perform the OR operation on the outputs of MOS logic circuits. The results of the operation cause the architecture output to transition into the first state. The second path is skewed, such that the transition into the second state occurs faster. Due to the amount of logic necessary to create the OR function in MOS, the first path is used to provide the transition into the first state, since the WIRED-OR logic comprises less stages of logic and the transition occurs faster. Thus, the transition of the architecture output from the second state to the first state and vice versa is provided by separate paths, such that the overall ORing functions occurs quicker.

BRIEF DESCRIPTION OF THE DRAWINGS

The present invention will be understood more fully from the detailed description given below and from the accompanying drawings of the preferred embodiment of the invention, which, however, should not be taken to limit the invention to the specific embodiments, but are for explanation and understanding only.

FIG. 1 illustrates the circuit architecture of the present invention.

FIG. 2 is a block diagram of the microprocessor of the present invention.

FIG. 3 is a circuit schematic of a comparator illustrative of the present invention.

FIG. 4 is a circuit schematic of the currently preferred embodiment of the NAND gate of the comparator of FIG. 3.

FIG. 5 is a circuit schematic of the currently preferred embodiment of the NOR gate of the comparator of FIG. 3.

DETAILED DESCRIPTION OF THE INVENTION

A static WIRED-OR BiNMOS logic circuit architecture with a skewed pull down path is described. In the following description, numerous specific details are set forth, such as specific voltages, transistor sizes, etc., in order to provide a thorough understanding of the preferred embodiment of the present invention. It will be obvious to those skilled in the art that the present invention may be practiced without these specific details. Also, well-known circuits have been shown in block diagram form only in order to avoid unnecessarily obscuring the present invention.

In the following discussion, the levels or states of inputs and outputs will be designated as a logical 1 or a logical 0 for discrete components. It shall be noted that the states of the inputs and outputs are also capable of being identified as a high or low, active or inactive, on or off, etc.

FIG. 1 illustrates the circuit architecture of the present invention. Referring to FIG. 1, circuit architecture 100 comprises combinational logic circuits $C_1$-$C_n$, where n is the integer 2 or greater. In the present invention, each combinational logic circuits $C_1$-$C_n$ represents any combinational logic circuit, including CMOS and BiCMOS, which is capable of providing at least one output in response to each of their inputs $C_{11\text{-}m}$ ... $C_{n1\text{-}m}$ respectively, where m is an integer of 1 or greater. The inputs to combinational logic circuits $C_1$-$C_n$ are label I/P in FIG. 1 to avoid obscuring the present invention. The output of each of the combinational logic circuits $C_1$-$C_n$ is coupled to the base of a bipolar transistor. Each bipolar transistor is coupled as an emitter follower with its emitter WIRED-OR to the output (O/P) 113. For example, the output of $C_1$ is coupled to the base of bipolar transistor 111 which is configured as an emitter follower with its collector coupled to a power supply potential. Another bipolar transistor in the pair, transistor 112, is shown coupled as an emitter follower with the base of transistor 112 being coupled to the output of transistor 111 (i.e., its emitter) and the output (emitter) of transistor 112 being coupled to the base of transistor 111. Thus, in this configuration, the emitter of transistor 112 feeds back to the base of bipolar transistor 111. In the currently preferred embodiment, each of the outputs of combinational logic circuits $C_2$-$C_n$ are coupled in the same manner to the base of a bipolar transistor where the emitters are WIRED-ORed to the output 113 (as shown in FIG. 1). However, it shall be noted that transistor 112 is only used for protecting transistor 111 when the base emitter junction of transistor 111 is being reversed biased. Thus, transistor 112 is a protection mechanism which might not be needed at all. Other protection mechanisms are available, such as a diode.

Also coupled to the output 113 of the OR circuit architecture is the output 113 from N-stack 119. In the currently preferred embodiment, N-stack 119 comprises one or more n-channel transistors coupled in series between output 114 and ground. Each gate of the n-channel transistors in the stack is coupled to and driven by a different output of NOR gates logic 118. NOR gates logic 118 comprises one or more NOR gates. In the currently preferred embodiment, NOR gate logic 118 comprises the same number of NOR gates as n-channel transistors in N-stack 119. The inputs to NOR gates logic 118 are coupled to receive the outputs of combinational logic circuits $C'_1$-$C'_n$. $C'_1$-$C'_n$ are skewed versions of $C_1$-$C_n$. $C'_1$-$C'_n$ are skewed for the pull down direction (i.e., the 1-to-0 transition at the output). In the present invention, each combinational logic circuits $C'_1$-$C'_n$ is capable of providing at least one output in response to each of the inputs they are coupled to receive ($C'_{11\text{-}m}$ ... $C'_{n1\text{-}m}$).

NOR gates logic 118 are skewed for the 0-to-1 transition, such that each output of NOR gates logic 118 transitions from 0-to-1 very fast. N-stack 119 is sized such that N-stack 119 transitions from 1 to 0 very fast. Thus, since $C'_1$-$C'_n$ and N-stack 119 are skewed for the 1-to-0 transition and NOR gates logic is skewed for the 0-to-1 transition, together they provide a fast pull down path. In this configuration, NOR gates logic 118 and N-stack 119 are configured as an OR gate implementation with a skewed pull down path. Since NOR gates 118 and N-stack 119 together provide a fast pull down path, its associated release of the output 113 during pull-up is slow. However, the fast pull up path is supplied by the circuit logic of $C_1$-$C_n$ and the WIRED-OR bipolar transistors.

The outputs of both sets of combinational logic, $C_1$-$C_n$ and $C'_1$-$C'_n$, drive OR circuit architecture 100. If any one of the logic circuits $C_1$-$C_n$ produce a 1 (high) output, then the bipolar transistor coupled to receive the output on its base will drive the output 113 high. In the currently preferred embodiment, each of the other bipolar transistor coupled to output 113 use a bipolar transistor that is coupled with its base to the output as a protection mechanism. It should be noted that if all of the logic circuits $C_1$-$C_n$ generate outputs of 0 (low), then output 113 will not be driven by any of the bipolar transistors and will be brought low by N-stack 119.

Similarly, if all of the outputs of $C_1$-$C_n$ are low, then all of the outputs of $C'_1$-$C'_n$ will be low. Since $C'_1$-$C'_n$ are skewed for the 1-to-0 transition, all of their outputs will transition from 1-to-0 quickly. NOR gates logic 118 receives the outputs of $C'_1$-$C'_n$ and provides a NOR function, such that if all of the outputs of $C'_1$-$C'_n$ are 0, then the outputs of NOR gate logic 118 will be one. Since NOR gate logic 118 are skewed for the 0-to-1 transition, when $C'_1$-$C'_n$ produce zero outputs quickly, NOR gate logic 118 will produce outputs of ones quickly. The output of each NOR gate in logic 118 turns on one of the transistors in N-state 119, which is sized for a fast 1-to-0 transition. Therefore, when the outputs of $C'_1$-$C'_n$ are all zeros, causing NOR gates logic 118 to generate outputs of all ones quickly, the transistors in N-stack 119 will pull the output 113 to ground quickly.

When any of the outputs of $C'_1$-$C'_n$ are ones, at least one of the NOR gates of logic 118 generates a 0 which causes N-stack 119 to switch from being coupled to ground, thereby allowing output 113 to transition to 1. Due to the skew of the path in the opposite direction, this occurs relatively slow. However, since the $C_1$-$C_n$ path has less stages of logic, it is capable of bringing output 113 to a 1 quickly. It should be noted that when transitioning to a 1, N-stack 119 temporarily operates as an NMOS circuit with pull down transistors acting as a load, due to the slowness of the transition from 0-to-1 in the skewed path. In other words, since N-stack 119 is slow to transition to 1, it will continue pulling output 113 to ground when the $C_1$-$C_n$ path is pulling output 113 up to a 1. Thus, N-stack 119 will effectively act as a load in this situation.

By using the BiNMOS technology, only the pull down path needs to be skewed. The speed of the pull up path is improved by eliminating two stages of CMOS gates and by using WIRED-OR bipolar transistors. Thus, speed of the both transitions is improved by reducing two stages in the pull up and by using special device sizing in the pull down path.

The present invention has a wide variety of applications. For example, the present invention can be applied in large fan-in logics where a large number of inputs contribute to a single output. This is especially applicable to having a Boolean function consisting of many terms and inputs which produce a single output generated using an OR gate function. In the currently preferred embodiment, the OR circuit architecture of the present invention is used in a comparator circuit in the instruction and data caches of a microprocessor.

FIG. 2 depicts a block diagram of the microprocessor 200 of the present invention. Processor 200 is utilized in conjunction with a computer system which generally includes includes a bus, a main memory, a static memory, a display device, an alphanumeric input device, and a hardcopy device (all of which are not shown to avoid obscuring the present invention). Of course, certain computer system implementations and uses of the present invention may not require nor include all of these components.

Referring to FIG. 2, microprocessor 200 generally comprises a prefetcher or instruction cache means 201 for prefetching instructions from main memory to be executed by microprocessor 200 and an instruction decoder 202 coupled with prefetcher 201 for decoding the instructions fetched by prefetcher 201. Decoder 202 is also coupled with execution pipeline unit 203. Decoder 202 supplies execution unit 203 with decoded instructions. In the currently preferred embodiment, execution pipeline unit comprises multiple execution pipeline units capable of executing integer and floating point instructions. To do so, execution pipeline unit 203 contains sets of address generation logic, arithmetic logic and cache memory interfaces. The memory interface of execution pipeline unit 203 is coupled with data cache 204. Execution pipeline unit 203 uses the cache memory interface to access data cache 204 for recently used data which data cache 204 temporarily stores until the data is written back to memory. Data cache 204 is also coupled with memory bus interface 207 which provides the interface between microprocessor and the main memory of the computer system. Bus interface allows both prefetcher 201 and data cache 204 to access main memory of the computer system.

Of course, certain implementations and uses of the present invention may not require nor include all or be limited solely to the above components. For example, in certain implementations, microprocessor 200 may have many more execution pipelines.

The currently preferred embodiment of the comparator circuit used in both instruction cache 201 and the data cache 204 is shown in FIG. 3. The operations and implementations of instruction cache 201 and data cache 204 are well-known in the art. Each of caches 201 and 204 contains a data random access memory (RAM) and a Tag RAM. The data RAM is a block of fast memory that stores the copies of the data and instructions frequently requested by microprocessor 200. The Tag RAM contains the original main memory address of code and data stored in the cache plus additional status bits used by the cache management logic. Each directory entry is called a "tag". When the microprocessor requests information from the main memory of the computer system, the memory request is sent to the cache. The cache management logic takes the memory request from the processor and compares it to the stored addresses in the Tag RAM. When the memory request address matches an address stored in the Tag RAM, the cache returns the information from the data RAM. If the memory request address does not match any entry in the Tag RAM, the memory request is passed on to the main memory of the computer system to the processor, and a copy of the received data is stored in the cache for future use. The cache architecture, including the circuiting and logic necessary to implement the cache of the present invention, is well-known in the art.

A comparator circuit is used in both instruction cache 201 and data cache 204 to compare the memory request from the processor, which takes the form of a physical address, with the stored addresses in the Tag RAM. The results of the comparison indicate whether the requested data or code is in the cache.

Referring to FIG. 3, comparator 300 comprises exclusive-NOR (XNOR) gates 301A–301X, skewed NAND gates 302A–302E, gate logic 303A–303E, NOR gates 304A–304B, N stack 305, inverters 306 and 307. Each of the 24 XNOR gates, labeled 301A-X, is coupled to receive one of the bits of the address PAADR[23:0] of the memory request on lines 321 and the corresponding address bit location of a tag address TAGOUT[23:0] on lines 320. Note that the expression [23:0] signifies a range of bit locations, in this case 24, which range from the least significant bit (e.g., 0 in this case) to the most significant bit (e.g., 23 in this case).

The outputs of XNOR gates 301A–301X, consisting of 24 bits [23:0] on lines 322 is coupled to the inputs of skewed NAND gates 302A–302E. Only NAND gate 302A is shown and is illustrative of the NAND gates 302B-E. Each of skewed NAND gates 302A-E is coupled to receive four of the outputs [23:0] (lines 322) from XNOR gates 301A-X. For instance, NAND gate 302A receives bits [3:0] of outputs [23:0] (lines 322). The results of the each NAND operation performed by NAND gates 302A-E are output on six lines [5:0] (lines 323). The outputs [5:0] on lines 323 are coupled to the inputs of the two NOR gates 304A–304B. In the currently preferred embodiment, each of NOR gates 304A and 304B are coupled to three of the outputs [5:0], such that all of the outputs [5:0] are input into the two NOR gates. If all of the inputs to either of NOR gates 304A and 304B are zeros, then that NOR gate generates an output of 1. On the other hand, if any of the inputs is a 1, then the output will be a zero.

The output of each of NOR gates 304A and 304B is coupled to a gate of an n-channel transistor in N-stack 305. In the currently preferred embodiment, N-stack 305 comprises multiple n-channel transistors coupled in series between ground and output node 327. The output of NOR gate 304A is coupled to the gate of n-channel transistor 305A, while the output of NOR gate 304B is coupled to the gate of n-channel transistor 305B. If a one is received on the gate of a transistor, the transistor turns on. Together transistors 305A and 305B act as a switch capable of pulling down output node 327 to ground when both transistors are switched on by the output of NOR gates 304A and 304B.

Note that another transistor, n-channel transistor 308, is coupled in series between ground and transistor stack 305. The gate of transistor 308 is coupled to a MATCH_ENABLE signal which is generated by the cache management logic. The MATCH_ENABLE signal indicates when the comparator is to perform a comparison. When the MATCH_ENABLE signal is a 1 (high), transistor 308 turns on, thereby allowing N-stack 305 to perform its function of pulling the output node 327 to ground. It should be further noted, however, that the present invention does not require such a transistor coupled to the N-stack 305 in the OR gate circuit of the present invention.

The [23:0] outputs of XNOR gates 301A–301X on lines 322 are also coupled to the inputs of logic gate circuitries 303A–303E. Only logic gate circuitry 303A is shown and is illustrative of the logic gate circuitries 303B–E. In the currently preferred embodiment, each of logic gate circuitries 303A–E is coupled to receive four of the outputs [23:0] from XNOR gates 301A–X. For instance, logic gate circuitry 303A receives bits [3:0] of the [23:0] outputs from lines 322. Each of logic gate circuitries 303A–E comprises a NAND gate and a pair of WIRED-OR bipolar transistors. Each pair of bipolar transistors is coupled to the output of the NAND gate in the same manner as described in FIG. 1, such that the emitter of the bipolar transistor is WIRED-OR to the output node 327. The inputs to each of logic gate circuitries 303A–E are coupled to the inputs of the NAND gate. If any one of the inputs of an NAND gate is zero, then its associated pair of WIRED-OR bipolar transistor will drive (i.e., pull up) output node 327 high. The results of the NAND operation performed by logic gate circuitries 303A–E are output on six lines [5:0] (lines 326). Each of the outputs [5:0] on lines 326 are coupled to the output node 327, such that each is capable of driving the output node 327 to a 1 (high).

In the currently preferred embodiment, comparator 300 includes inverter circuit configuration, identified as block 307. Block 307 pulls up the output node 327 when comparator 300 is not enabled. The purpose in pulling up output node 327 when comparator 300 is disabled is to place comparator 300 in a known state. Block 307 comprises an n-channel transistor 307B and a p-channel transistor 307B coupled in series as an inverter. The inverter is coupled, such that n-channel transistor 307B is sourced by a powerdown signal. The powerdown signal eliminates the relatively small amount of current drawn by the protection device. Note that transistor 307B does not have to be sourced by the powerdown signal, but instead can be sourced by ground. The input of the inverter is coupled to the MATCH_ENABLE signal. The output of the inverter is coupled to bipolar transistors 307C and 307D which are coupled such that the emitter of transistor 307D is WIRED-OR to output path 327. It should be noted that block 307 is not required to implement the comparator of the present invention.

Output node 327 is coupled to the input of inverter 306. The output of inverter 306 is the output of comparator 300. If the output of inverter 306 is 1, a tag match occurs between the tag and the address of the memory request. If the output of inverter 306 is a 0, then a tag match did not result from the comparison between the tag and the address of the memory request. It should be noted that inverter 306 is not required in order to implement the OR circuit architecture of the present invention.

FIG. 4 is a circuit schematic of the NAND gate used in the comparator of the present invention. Referring to FIG. 4, NAND gate 400 comprises n-channel transistors 401–408 and p-channel transistors 412–415. Transistors 401–404 are coupled in series between nodes 421 and 422. Transistors 405–408 are also coupled in series between nodes 421 and 422. In the case of the currently preferred embodiment of NAND gates 302A–E, node 422 is coupled to ground. Node 421 is coupled to output node 416. The gates of transistors 404 and 405 are coupled to a fourth input IN1. The gates of transistors 403 and 406 are coupled to a fourth input IN2. The gates of transistors 402 and 407 are coupled to a fourth input IN3. The gates of transistors 401 and 408 are coupled to a fourth input IN4. Transistors 412–415 are all coupled in parallel. Transistors 412–415 are all sourced by the power supply potential. The gates of transistors 412–415 are coupled to inputs IN4, IN3, IN2 and IN1 respectively. The drains of transistors 412–415 are all coupled together and coupled to node 416.

The operation of NAND gate 400 is well-known in the art. If all of the inputs IN1–IN4 are all ones (high), then series transistors 401–408 are all on, pulling the output at node 416 to ground. P-channel devices 412–415 are off, such that no current flows. However, if either IN1, IN2, IN3, IN4, or any combination of the four, is a zero (low), then the corresponding p-channel devices (either transition 412, 413, 414 or 415 respectively) is on, pulling the output at node 416 to a 1 (high). Since one (or more) of the series transistors 401–408 is off, no current flows.

In the currently preferred embodiment of NAND gates 302A–E, the output is taken at node 416. This output is then received at the inputs of NOR gates 304A–B. Furthermore, NAND gates 302A–E are skewed for the pull down path. To effectuate the skew, transistors 401–408 are larger than their corresponding counterparts in logic gate circuitries 303A–E. In the currently preferred embodiment, transistors 401 and 405 are 10$\mu$ wide and 1$\mu$ long, transistors 402 and 406 are 12$\mu$ wide and 1$\mu$ long, transistors 403 and 407 are 14$\mu$ wide and 1$\mu$ long, transistors 404 and 408 are 16$\mu$ wide and 1$\mu$ long. The large widths of these devices cause the 1-to-0 transition of each NAND gate of NAND gates 302A–E to be fast. In the currently preferred embodiment, the size of p-channel transistors 412–415 are each 4$\mu$ wide to 1$\mu$ long.

In the currently preferred embodiment of logic circuitries 303A–E, each NAND gate, such as NAND gate 310, uses smaller sized devices for transistors 401–408, and its output is not skewed for either transition. In the currently preferred embodiment, each of transistors 401–408 is 2.2$\mu$ wide to 1$\mu$ long. Also the size of p-channel transistors 412–415 in the NAND gate logic circuitries 303A–E are 5$\mu$ wide to 1$\mu$ long. FIG. 4 also depicts the inclusion of bipolar transistors 409 and 410 which provide a WIRED-OR connection to the output node when NAND gate 400 is used for logic circuitries 303A–E. It should be reiterated that transistors 409 and 410 are not included in NAND gates 302A–E. Also in the currently preferred embodiment, node 422 is coupled to the powerdown signal, such that when the cache is in a reduced power consumption state, the output is not pulled to ground regardless of the state of inputs IN1-IN4, such that NAND gate 400 does not operate.

FIG. 5 is the currently preferred embodiment of the circuit schematic for each of NOR gates 304A and 304B. In the currently preferred embodiment, each NOR gate is coupled to receive three inputs, labeled IN1, IN2 and IN3, and generates one output, OUTPUT. NOR gate 500 is comprised of p-channel transistors 501-506, n-channel transistors 507-509 and 512-514, and bipolar transistors 510 and 511. Transistors 501-503 are coupled in series between the power supply voltage and node 521. Transistors 504-506 are also coupled in series between the power supply voltage and node 521. The gates of transistors 501 and 506 are coupled to the input IN1. The gates of transistors 502 and 505 are coupled to the input IN2. The gates of transistors 503 and 504 are coupled to the input IN3. Inputs IN1, IN2 and IN3 are also coupled to the gates of transistors 509, 508 and 507 respectively and the gates of transistors 514, 513, and 512 respectively. Transistors 507-509 are coupled in parallel. The sources of transistors 507-509 are coupled to node 524, which is coupled to ground. Similarly, transistors 512-514 are coupled in parallel. The sources of transistors 512-514 are coupled to node 525, which is coupled to ground. The drains of transistors 507-509 are coupled to node 522, while the drains of transistors 512-514 are coupled to node 523. (the OUTPUT of NOR gate 500).

Nodes 521 and 522 are coupled together and are coupled to the base of bipolar transistor 510. Transistor 510 is coupled as an emitter follower with the power supply potential coupled to its collector. The emitter, or output, of transistor 510 is coupled to the OUTPUT of NOR gate 500 at node 523. The emitter of transistor 510 is also coupled to the base of bipolar transistor 511, which is also coupled as an emitter follower with the power supply potential coupled to its collector. The emitter of transistor 511 is coupled as a feedback to the gate of transistor 510.

NOR gate 500 operates according to the inputs IN-1-IN3. If IN1-IN3 are all zeros, series p-channel devices 501-503 and 504-506 switch on, pulling node 521, and thus the base of bipolar transistor 510, to a 1 (high). In response, bipolar device 510 pulls the output high at node 523. N-channel devices 507-509 and 512-514 are off; therefore, no current flows. However, if wither IN1, IN2, or IN3 (or any combination of the three) is a 1, the corresponding n-channel device is on, pulling both nodes 522 and 523 to ground, thereby bringing the output to ground. In this case, p-channel devices 501-506 are off, so no current flows.

The sizes of the devices comprising NOR gate 500 cause the output of NOR gate 500 to be skewed. The output of NOR gate 500 is skewed for the 0-to-1 transition, such that when NOR gate 500 receives all 0 inputs, then its output transitions from 0-to-1 faster than it transitions from 1-to-0. In the currently preferred embodiment, to implement the skew, transistors 501 and 504 are $20\mu$ wide to $1\mu$ long, transistors 502 and 505 are $17\mu$ wide to $1\mu$ long, transistors 503 and 506 are $14\mu$ wide to $1\mu$ long. Furthermore, transistors 507-509 are all $2.7\mu$ wide to 1 long, while transistors 512-514 are $11\mu$ wide to $1\mu$ long.

Referring back to FIG. 3, N-stack 305 is sized for a fast 1-to-0 transition, such that when the transistor in N-stack 305 receive high inputs (i.e., ones) on their gates from NOR gates 304A and 304B, then its output, which is coupled to output path 327, transitions from 1-to-0 quickly. In the currently preferred embodiment, each of the n-channel devices in N-stack 305 is $28\mu$ wide to $1\mu$ long. It should be reiterated that in the currently preferred embodiment, N-stack 305 will not pull output path 327 to ground unless transistor 308 is turned on (i.e., the comparator is enabled). Note that transistor 308 is not generally needed for the comparator of the present invention. Since the output of NAND gates 303A-E are skewed for the 1-to-0 transition and the output of NOR gates 304A-B are skewed for the 0-to-1 transition, the fact that N-stack 305 is sized for a fast 1-to-0 transition causes the path comprising NAND gates 302A-E, NOR gates 304A-B and N-stack 305 to be skewed for the 1-to-0 transition.

Therefore, comparator 300 has two paths. Each path is configured to provide one of the transitions (i.e., 1-to-0 or 0-to-1) quickly. The path comprising logic circuitries 303A-E transitions from 0-to-1 quickly while the path comprising NAND gates 302A-E, NOR gates 304A-E, NOR gates 304A-B and N-stack 305 transitions from 1-to-0 quickly. Because comparator 300 is used on the data and instruction path for the microporcessor, the present invention provides a means for completing the results of the required comparisons faster than the prior art.

The present invention provides an OR function circuit architecture which is 33% faster than the prior art. Furthermore, the present invention comprises a unique combination of CMOS and bipolar technologies.

Whereas many alterations upon applications of the present invention will no doubt become apparent to a person of ordinary skill in the art after having read the foregoing description, it is understood that the particular embodiment shown and described by illustration is in no way intended to be limiting. For instance, although the circuit architecture of the present invention is described for use in a comparator, the present invention is not limited to such an application. Therefore, reference to details of the preferred embodiments are not intended to limit the scope of the claims which themselves recite only those features regarded as essential to the invention.

Thus, a static WIRED-OR BiNMOS logic circuit architecture having a skewed pull down path has been described.

I claim:

1. A circuit comprising:
an output node;
a first plurality of MOS logic circuits, each of said first plurality of MOS logic circuits generating a first output capable of being at a first or second logic state;
a plurality of bipolar transistor circuit means coupled to and responsive to the outputs of said first plurality of MOS logic circuits, said plurality of bipolar transistor circuit means coupled in a WIRED-OR configuration to said output node and for transitioning said output node to the first state if at least one of said first plurality is in the first state;
a second plurality of MOS logic circuits, each of said second plurality of MOS logic having a second output capable of being at a first or second state, wherein each of the second plurality of MOS logic circuits is a skewed version of each of said first plurality of MOS logic circuits, such that the transition of each second output from the first state to the second state is faster than the transition from the second state to the first state;

ORing means coupled to receive the second outputs from said second plurality, wherein the ORing means has a third output coupled to the output node, such that if all of said second outputs are in the second state then the output node is in said second state;

wherein the transition of the output node from the second state to the first state is provided by said first plurality of MOS logic circuits and said plurality of bipolar transistor circuit means and the transition of the output from the first state to the second state is provided by the second plurality of MOS logic circuits and said ORing means.

2. The circuit as defined in claim 1 wherein the first and second plurality of MOS logic circuits comprise complementary MOS (CMOS) logic.

3. The circuit as defined in claim 1 wherein said ORing means includes:

at least one NORing means coupled to the outputs of said second plurality, each of said at least one NORing means for providing an intermediate output indicative of a NORing function in response to the outputs of said second plurality, wherein said intermediate output is capable of being at a first or second state and is skewed, such that the transition of the intermediate output from the second state to the first state is faster than the transition from the first state to the second state; and second circuit means coupled to receive the intermediate outputs from said at least one NORing means and putting the output node in the second state, wherein said second circuit means is skewed, such that the transition of the output node from the first state to the second state is faster than the transition from the second state to the first state.

4. The circuit as defined in claim 3 wherein the at least one NORing means comprises at least one NOR gate.

5. The circuit as defined in claim 3 wherein said second circuit means comprises a transistor stack having at least one transistor device.

6. The circuit as defined in claim 5 wherein each transistor in said transistor stack comprises an n-channel transistor.

7. The circuit as defined in claim 1 wherein each of said plurality of bipolar transistor circuit means includes a protection mechanism.

8. The circuit as defined in claim 7 wherein said protection mechanism comprises a bipolar device.

9. The circuit as defined in claim 7 wherein said protection mechanism comprises a diode.

10. A circuit for providing an OR function on the outputs of at least two MOS logic circuits comprising:

an output node capable of being in a first or second logic state and being responsive to a first or second path;

a first path including a plurality of WIRED-OR means responsive to the outputs of said at least two MOS logic circuits, such that if at least one of said MOS logic circuits is in the first state then the first path transitions the output node into the first state;

a second path including a skewed version of each of said at least two MOS logic circuits, wherein said at least two MOS logic circuits are skewed for the second state, such that the second path is capable of transitioning the output node from the first state to the second state faster than transitioning the output node from the second state to the first state;

wherein the transition of the output node from the first state to the second state is provided by said second path and the transition of the output node from the second state to the first state is provided by said first path.

11. A comparator for use in performing a tag matching operation between the address of a memory request and the tag address in a cache for a microprocessor comprising:

an output node;

a plurality of exclusive-NOR gate means for receiving the address of the memory request and the tag address and performing the exclusive-NOR function on corresponding bit locations of the two addresses, each of said plurality of exclusive-OR gate means producing a first output;

a first plurality of NAND gate means, wherein each of said NAND gate means generates a second output capable of being at a first or second logic state as a result of performing a NAND function on the first outputs of said plurality of exclusive-OR gate means;

a plurality of bipolar circuit means coupled to and responsive to the outputs of said first plurality of NAND, said plurality of bipolar transistor circuit means coupled in a WIRED-OR configuration to said output node and for transitioning said output node to the first state if at least one of said first plurality is in the first state;

a second plurality of MOS NAND gate means, each of said second plurality having a third output capable of being at a first or second logic state, wherein each of the second plurality is a skewed version of each of said first plurality, such that the transition of the third output from the first state to the second state is faster than the transition from the second state to the first state;

ORing means coupled to recieve the third outputs from said second plurality, wherein said ORing means produces a fourth output coupled to the output node, such that if the third output of at least one of said second plurality of MOS NAND gate means is in the second state then the output is put in the second state and;

wherein the transition of the output node from the second state to the first state is provided by said second plurality and said ORing means and the transition of the output node from the first state to the second state is provided by the first plurality and the plurality of bipolar circuit means, such that if said output node is in said first state then the comparator indicates that a match occurred and if said output node is in said second state then the said comparator indicates that a match did not occur.

* * * * *